(12) United States Patent
Brubaker

(10) Patent No.: US 7,468,686 B2
(45) Date of Patent: Dec. 23, 2008

(54) SYSTEMS AND METHODS FOR PROVIDING COMPACT DIGITALLY CONTROLLED TRIM OF MULTI-SEGMENT CIRCUITS

(75) Inventor: James Lee Brubaker, Fremont, CA (US)

(73) Assignee: Linear Technology Corporation, Milpitas, CA (US)

( * ) Notice: Subject to any disclaimer, the term of this patent is extended or adjusted under 35 U.S.C. 154(b) by 51 days.

(21) Appl. No.: 11/671,666

(22) Filed: Feb. 6, 2007

(65) Prior Publication Data

US 2008/0186215 A1 Aug. 7, 2008

(51) Int. Cl.
*H03M 1/10* (2006.01)
(52) U.S. Cl. .................. 341/121; 341/145; 341/154
(58) Field of Classification Search ............. 341/121, 341/145, 154
See application file for complete search history.

(56) References Cited

U.S. PATENT DOCUMENTS

| | | | | |
|---|---|---|---|---|
| 5,084,667 A | * | 1/1992 | Drori et al. | ......... 323/298 |
| 5,666,118 A | * | 9/1997 | Gersbach | ............ 341/120 |
| 6,201,491 B1 | * | 3/2001 | Brunolli et al. | ......... 341/144 |
| 7,012,555 B2 | * | 3/2006 | Voicu et al. | ............ 341/154 |
| 2003/0011464 A1 | * | 1/2003 | Eck et al. | ............ 338/123 |

* cited by examiner

*Primary Examiner*—Khai M Nguyen
(74) *Attorney, Agent, or Firm*—McDermott Will & Emery LLP

(57) ABSTRACT

A trimdac circuit for adjusting the output of a digital-to-analog converter (DAC) is provided. The trimdac may be used to adjust a plurality of resistor segments in the DAC. The trimdac may include a programmable Read Only Memory (ROM) or other suitable memory device. The ROM may include a plurality of multi-bit digital words. Each of the multi-bit digital words may control a plurality, and most preferably a pair of variable resistance circuits. Each of the pair of variable resistance circuits may adjust a resistor segment of the DAC.

34 Claims, 8 Drawing Sheets

SYSTEMS AND METHODS FOR PROVIDING COMPACT DIGITALLY CONTROLLED TRIM OF MULTI-SEGMENT CIRCUITS

BACKGROUND OF INVENTION

The present invention relates to providing a practical, compact digitally-controlled trim of a circuit having a digital input, such as a Digital-to-Analog Converter (DAC). More particularly, this invention relates to applying the trim to more than one element or location in the circuit. Often, these types of circuits include elements or trim locations that have a strong effect on the output for some input code states, and a very weak effect, for other code states.

PRIOR ART

To better understand this problem as it occurs in DACs, a short introduction to DACs will be presented. Then, the relationship between the problem stated above and DACs will be discussed.

DACs translate binary signals from computers or other discrete circuitry into proportional analog voltage levels, DACs are commonly used to drive analog devices such as meters, motor controllers, or audio circuitry.

The binary weighted resistor network DAC is the simplest method of converting digital bits from a digital signal into an analog signal. For the circuit 100 shown in FIG. 1, a binary signal is applied to gating circuits 118 that drive analog switches 102, 104, 106 and 108. When a binary signal of 0000 is applied to the switches, all the switches are open so no voltage is applied to the op amp 122, At this point, the output is 0 volts. When a 0001 binary signal is applied, switch 102 closes and 10 volts is applied to resistor 110. Because the input of op amp 122 represents virtual ground, there is 10 volts across the 8000 ohm resistor 110, That causes 10V/8000 ohm, or 1.25 milliamps, to flow through the 800 ohm feedback resistor 120. By Ohm's law, the voltage across resistor 120 would be 800 ohm×1.25 milliamps, or 1 volt.

When the binary signal changes to 0010, switch 102 opens and switch 104 closes. That causes 2.5 milliamps (10 volts/ 4000 ohms) to flow through resistor 120. The voltage across resistor 120 is then 800 ohms×2.5 milliamps, or 2 volts. A binary 0100 would create 4 volts at the output, and so on, A binary-weighted resistor network DAC is not practical, however, for applications requiring much more than 4 bits of resolution because the range of resistor values required is very large and difficult to fabricate accurately. An R 2R ladder network has become the DAG of choice, therefore, in most applications.

The R 2R ladder network is capable of producing binary weighted voltages with resistors having only two different values of resistance arranged in a type of network known as a binary ladder, shown in FIG. 2. In this circuit, a series of latches 240 are used to drive analog switches 202, 204, 206 and 208.

The R-2R ladder operates such that, when an individual switch is closed, each "rung" on the R-2R ladder delivers a current to the virtual ground node. Because of the arrangement of resistors 210, 212, 214, 216, 218, 220, 222 and 224, the current delivered by each successive rung is binarily weighted. Thus, each successive switch going down the ladder, when connected, produces a current, which, in turn, produces half the output voltage of the switch above it.

For example, when a binary 0000 is transmitted to latches 240, this opens all of the switches and disconnects VREF from the output. This causes 0 volts to appear at the output of the op amp 230. A binary signal of 1000 will close switch 202, thus activating the MSB (most significant bit). By Ohm's law, the current flowing through resistor 210 will cause a 5 volt signal to appear at the output. A signal of 0100 open switch 202 and closes switch 204 and results in a 2.5 volt signal at the output.

The primary advantage of the binary ladder design over the binary weighted resistor network DAC is its use of resistors having only two resistor values. As a result, it is a simple matter to process virtually any number of bits simply by adding additional "rungs" to the ladder.

In resistor ladder DACs operating in the voltage switching (VOUT) mode, different bits have different propagation delay through the resistor ladder to the output. These different propagation delays typically create large major carry glitch impulse errors, A major carry occurs when an MSB (most significant bit) is turned OFF and all the LSBs (lease significant bits) are turned ON.

To reduce this effect, it is conventional to segment the (4) most significant bits of a 16-bit DAC into (15) equally weighted segments, all of which have about the same propagation delay to the output. These 15 equally weighted bits are commonly referred to as thermometer coded as opposed to binary-encoded because a four-bit thermometer code has fifteen distinct transitions representing the sixteen possible values of a four-bit input, i.e., from 0000 to 1111. These bits do not require resistors between successive segments because they provide sequentially weighted signals and not binarily weighted signals. Any number of the bits in the DAC can be thermometer-encoded.

Another reason to segment the MSBs into one group of thermometer-coded bits is to reduce the sensitivity of the transfer function to any one ladder element.

As stated above, a 16-bit DAC may have its four MSBs broken down into (15) equivalent MSB segments, each having a weight of 4,096 LSBs. Such DACs generally use laser trim—i.e., using a laser to adjust the resistances of the resistors in the DAC to implement the addition or subtraction of a small voltage to obtain a more linear result (a result that more closely corresponds to the ideal analog output of the converter) from the output of the DAC. To achieve the required wide ratio between trim range and trim sensitivity, a continuous trim resistor trim tab—i.e., wherein a portion of a resistor of pre-determined configuration or shape is selectively shaped using a Laser—is typically used. Some prior art DACs also use "link trims" in which a resistive element or elements in a complicated resistor network is selectively entirely opened by the laser to obtain a total resistance that corresponds to the optimal resistance of the segment of the DAC.

Problems of Prior Art

A problem with continuous tab trims is that they are typically slow. A new, precise measurement of error must be made after each small increment of the laser position in order to determine when to stop the trim—i.e., when to terminate the laser burn of the resistor. Another problem is that resistor tab trims are prone to post trim drift. These problems are further compounded by a high number of MSB segments, Link trims are generally faster and less prone to post trim drift, but they consume far more area, since many bits of link trim—i.e., resistors in a complex resistor network—may be needed to achieve the required trim range and resolution. The area penalty becomes much greater when more than a few bits of trim are used because additional elements are needed to achieve the wide range in trim weights.

It would be desirable to provide a practical, compact, digitally-controlled, trim of a DAC.

It would also be desirable to provide circuits and methods of applying the trim to more than one element or location at one time—e.g., preferably substantially simultaneously,

SUMMARY OF THE INVENTION

It is an object of the invention to provide a practical, compact digitally controlled trim of a DAC.

It is a further object of the invention to provide circuits and methods of applying the trim to more than one element or location at one time—e.g., preferably substantially simultaneously.

The invention includes a circuit for adjusting the output of a DAC by adjusting a plurality of resistor segments in the DAC. The circuit preferably includes a programmable Read Only Memory (ROM). The ROM may include a plurality of multi-bit digital words. Each of the digital words may control a plurality of variable impedance structures. Each of the plurality of variable impedance structures may be configured to adjust a resistor segment in the DAC.

BRIEF DESCRIPTION OF THE DRAWINGS

The following detailed description of the embodiments of the present disclosure can best be understood when read in conjunction with the following drawings, in which the features are not necessarily drawn to scale but rather are drawn as to best illustrate the pertinent features, wherein.

DETAILED DESCRIPTION OF INVENTION

In one embodiment of the invention, the proposed circuits and methods use a fully link based trim, which preferably substantially eliminates the trim time and post-trim drift problems of tab trims. To avoid excessive area and capacitance, the fine trim of the MSB segments is preferably performed by programming a ROM containing fourteen (14) 8-bit words. Accordingly, the ROM controls a compact 8-bit trimdac structure. Although the trimdac is more complicated and larger than the trim link structure required to trim a single segment, it is far smaller than the (15) such trim structures that would be required to trim all segments.

In one exemplary embodiment of the invention using a 16-bit DAC, the ROM word is preferably selected based on the state of (4) DAC MSB's, D15, D14, D13 and D12. There are (16) possible states, named S0, S1, ... S14, S15, For states S0 and S15, all of the (15) MSB segments are all tied low or high, respectfully, which may make the trimdac according to the invention ineffective.

One difficult problem solved by the invention is that, there seems to be no practical way to apply a single trimdac based trim to the segmented MSBs of a voltage switching resistor ladder DAC Because the circuit is passive and has extremely small full scale and zero scale errors, the trim must be applied by adjusting one or more of the existing resistor segments. However, the sensitivity of Vout to a variation in any single resistor segment is higher in some regions of the DAC transfer function and very low in others.

Figure 1:
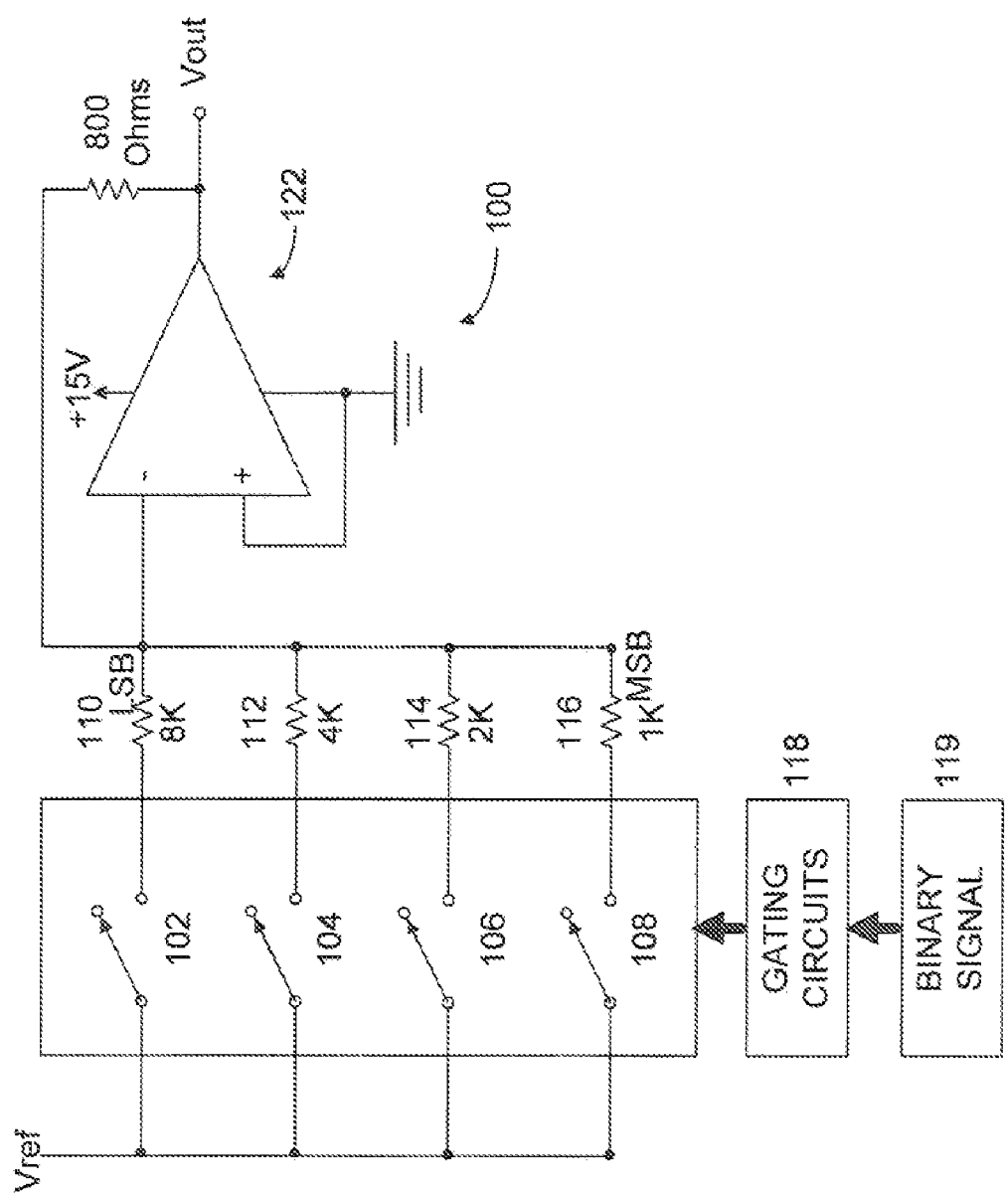
FIG. 1 is a schematic diagram of a conventional binary-weighted resistor network DAC.
Figure 2:
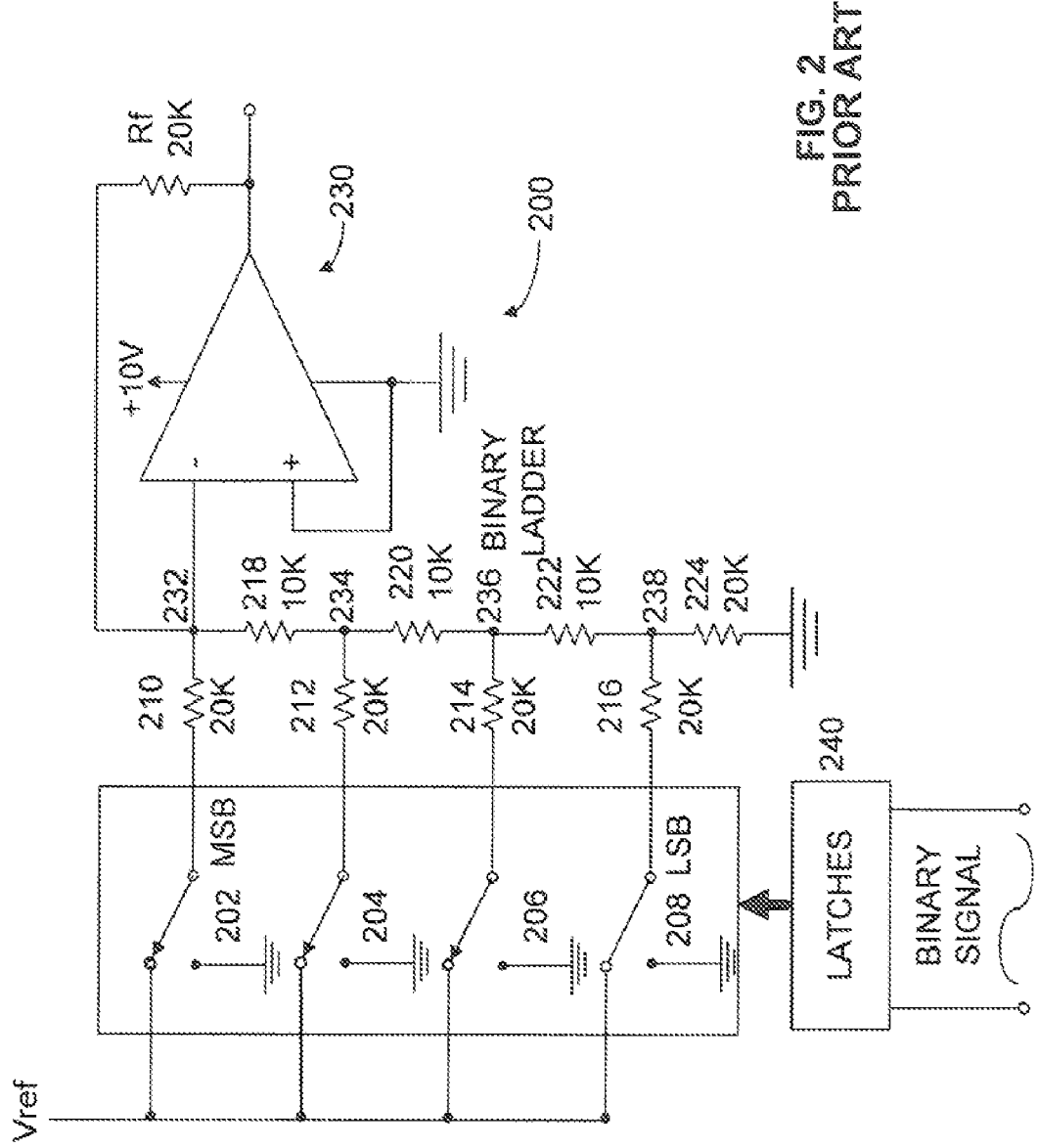
FIG. 2 is a schematic diagram of a conventional segmented ladder network DAC.
Figure 3:
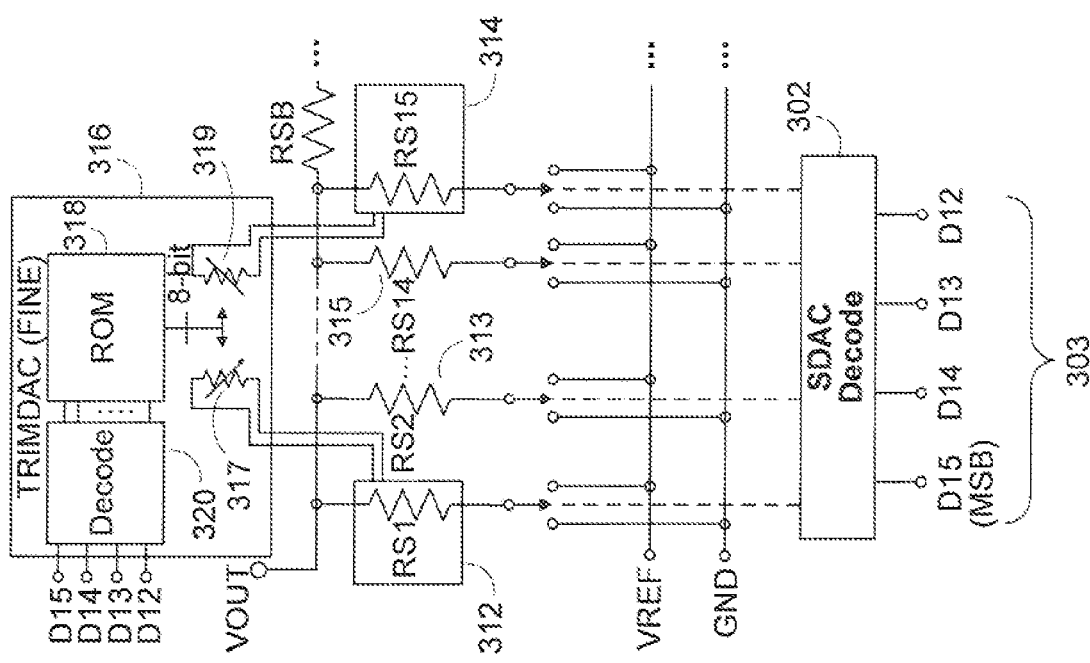
FIG. 3 is a schematic diagram of a portion of an R-2R ladder network DAC according to the invention.

FIG. 3 shows a simplified block diagram for a circuit according to the invention, FIG. 3 shows how the trimdac 316 ties into the RS1 and RS15 segments 312 and 314 (only RS1, RS2, RS14 and RS15 of the (15) SDAC segments are shown), Trimdac 316 includes ROM 318 and decode 320, Trimdac 316 is also configured to receive inputs from the four MSBs 305 (bits D12-D15) in order to identify the state of the MSBs. The respective states of the MSBs provide the information necessary to determine which ROM word stored in trimdac 306 to select. In alternate embodiments, trimdac 316 may preferably be implemented for a different complementary pair of the segments of the MSBs—e.g., for pair RS1 312 and RS15 314 (as shown), for pair RS2 313 and RS14 315 (as shown), for pair RS3 and RS14 (not shown), etc. Trimdac 316 also may include variable resistors 317 and 319 (which may preferably be implemented to adjust the resistance of the resistors that they are trimming) which are set by a signal from ROM 318, Variable resistors 317 and 313, which may be implemented in any suitable fashion or impedance type, are used to correct the non-linearities of the output of the DAC.

Figure 4:
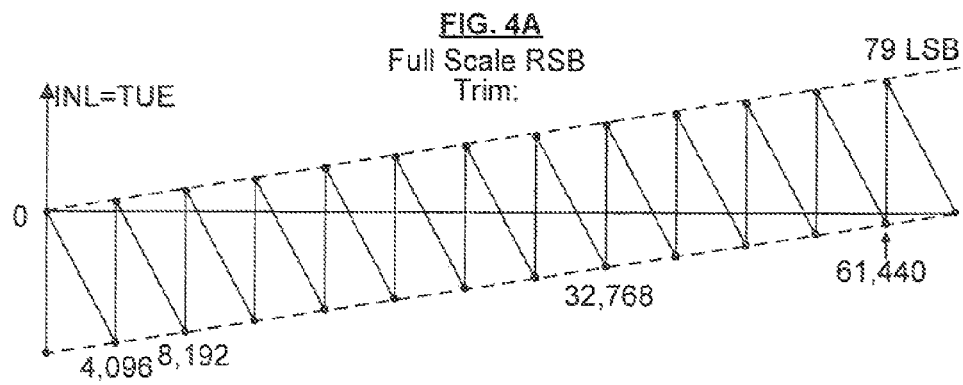
FIG. 4 is a diagram that shows the effect on DAC linearity of full-scale trim at a number of selected trim locations.
Figure 4:
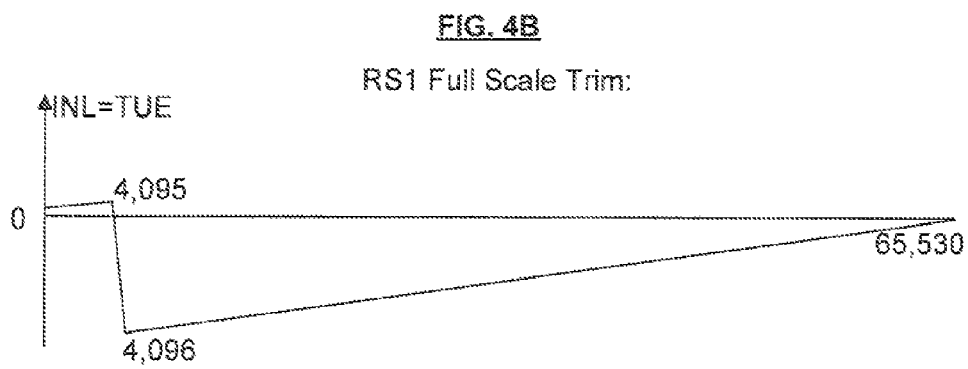
Figure 4:
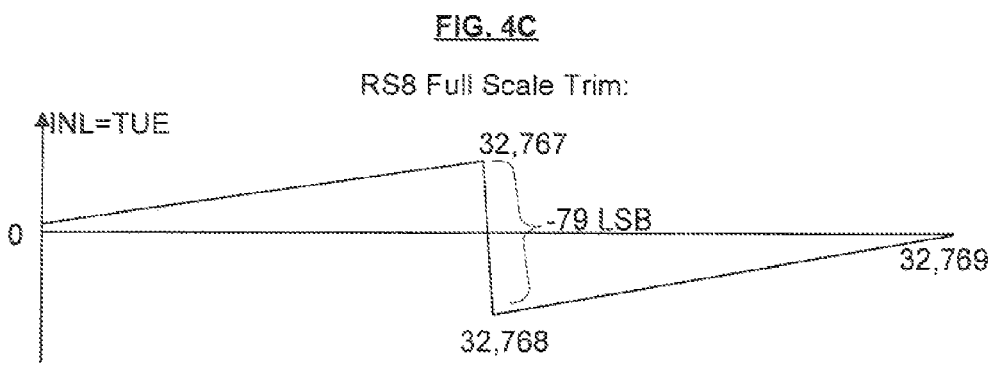
Figure 4:
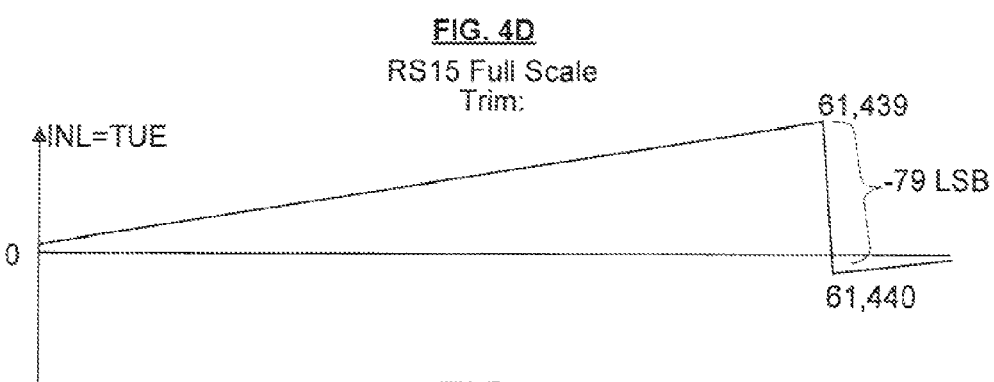

FIG. 4, including FIGS. 4A-4D, shows the effect on the DAC linearity of coarse-adjusting (trimming) the value of RSB shown in FIG. 3 (FIG. 4A), RS1 (FIG. 4B), RS8 (FIG. 4C), or RS15 (FIG, 4D), respectively.

In one preferable embodiment according to the invention, trimdac 316 finely trims/adjusts both RS1 and RS15 preferably substantially simultaneously, but in a complementary fashion—e.g., RS15 314 is trimmed to have higher resistance when RS1 312 is trimmed to have lower resistance and vice versa.

As described above, this is preferably accomplished according to the invention with the pair of variable resistance circuits 317 and 319 which are controlled by a single 8-bit ROM word. The circuits 317 and 319. preferably receive 2's complement-coded inputs, so midscale corresponds to no trim and +/− Full Scale correspond to −3.8 LSB and +3.8 LSB of INL trim, respectively.

Figure 5:
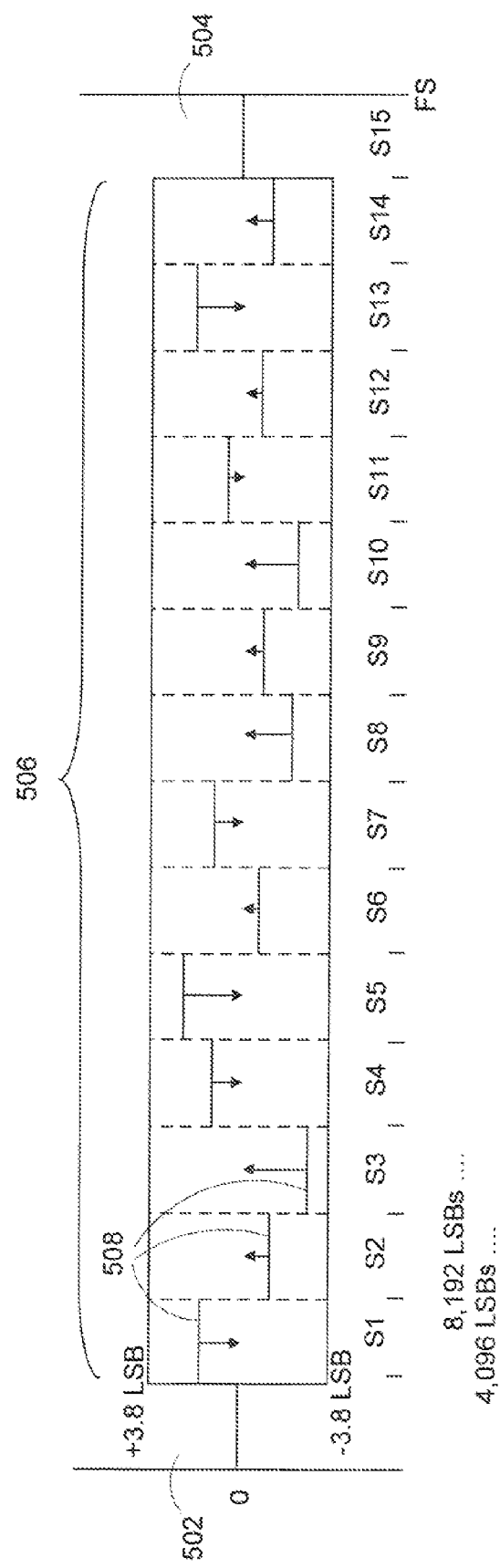
FIG. 5 is a diagram that shows the effect of one embodiment of full-scale trim according to the invention.

FIG. 5, shows the possible fine trim adjustments achievable with the trimdac 316. The upper and lower envelopes 502 and 504 of the graphs show the INL trim produced if the trimdac code is held at +FS (full scale) or −FS. The 14 regions in between 506 represent the range of DAC codes where trimdac 316 may be controlled by each of the (14) ROM words, and the individual lines 508 in each of the regions 506 shown represent an arbitrary set of possible ROM codes.

In one embodiment of the invention, 8-bit trimdac 316 (which could be configured with any suitable number of bits) is divided into (2) MSB, (3) Middle Bits, and (3) LSB sections. Each of these different sections preferably tie into (are preferably implemented with) different tap points in the RS1/RS15 resistor structure. This serves to minimize bit interaction, which may be difficult to avoid in variable resistor circuits.

It should be noted that controlled Rsw transmission switch structures may be controlled by the input (ROM) code to set the trimdac resistance value. Such Rsw transmission switch structures are disclosed in copending U.S. patent application Ser. No. 11/671628 entitled, "SYSTEMS AND METHODS FOR SWITCH RESISTANCE CONTROL IN DIGITAL TO ANALOG CONVERTERS (DACS)" which is hereby incorporated by reference herein in its entirety. The transmission switch structures may have a parallel Nchannel and Pchannel pair. To turn the switch ON, the gates of the switches can be tied to VGN and VGP. In one embodiment, the transmission switch structures tie to the SW_1S and SW_15S nodes, which are driven to either REFHI or REFLO depending on the S1 and S15 digital inputs.

In this embodiment, when the SW_node is pulled to REFHI the Pchannel transmission switch device is ON (Vgate=VGP) and has a Rsw that tracks Rtf The Nchannel switch has a negative VGS and may be OFF, When the SW_node is pulled to REFLO the Nchannel transmission switch device is ON (Vgate=VGN) and has a Rsw that tracks Rtf. The Pchannel switch has a positive VGS and is OFF.

Figure 6:
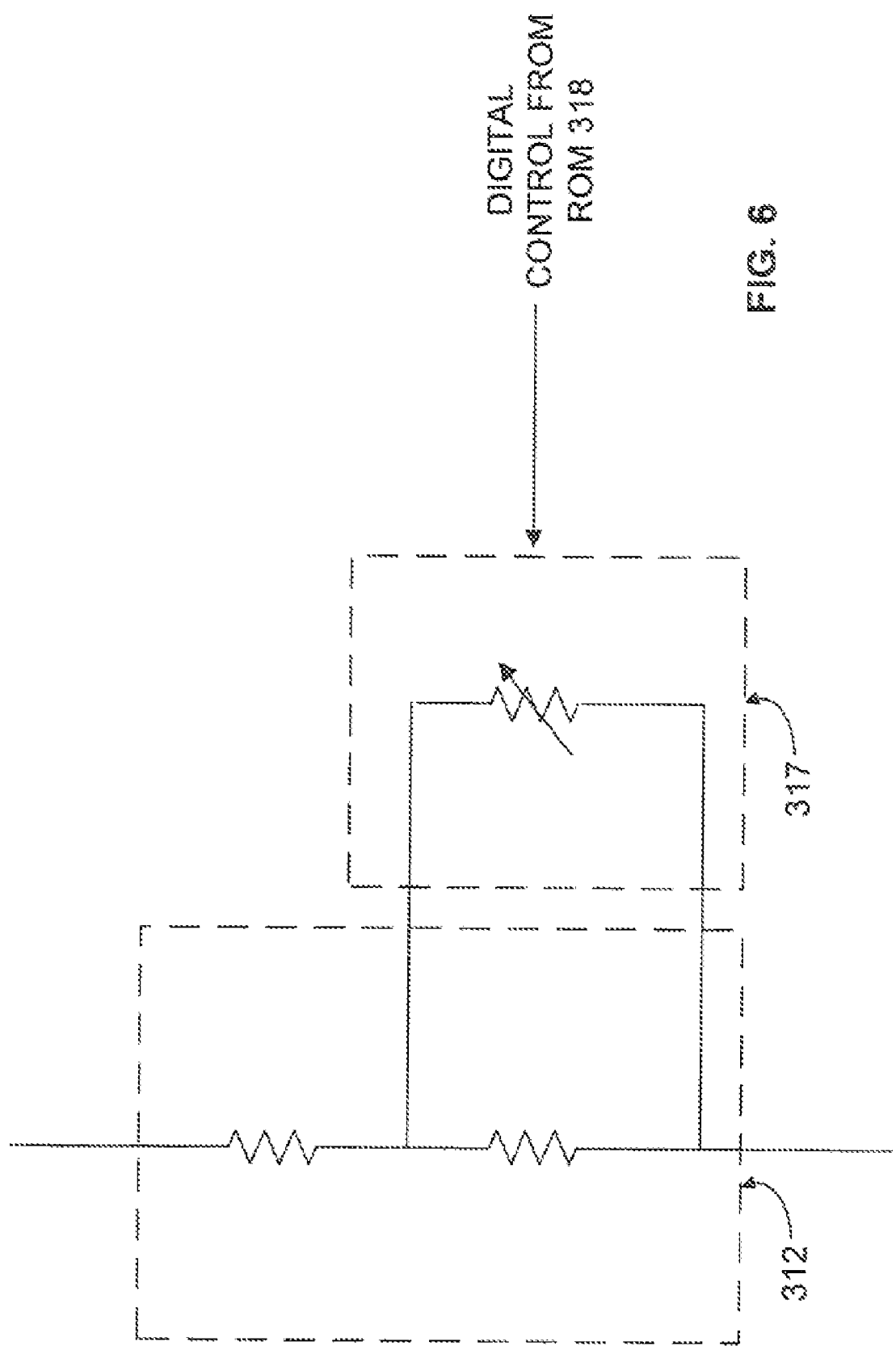
FIG. 6 is a schematic diagram that illustrates a portion of FIG. 5 in greater detail.
Figure 7:
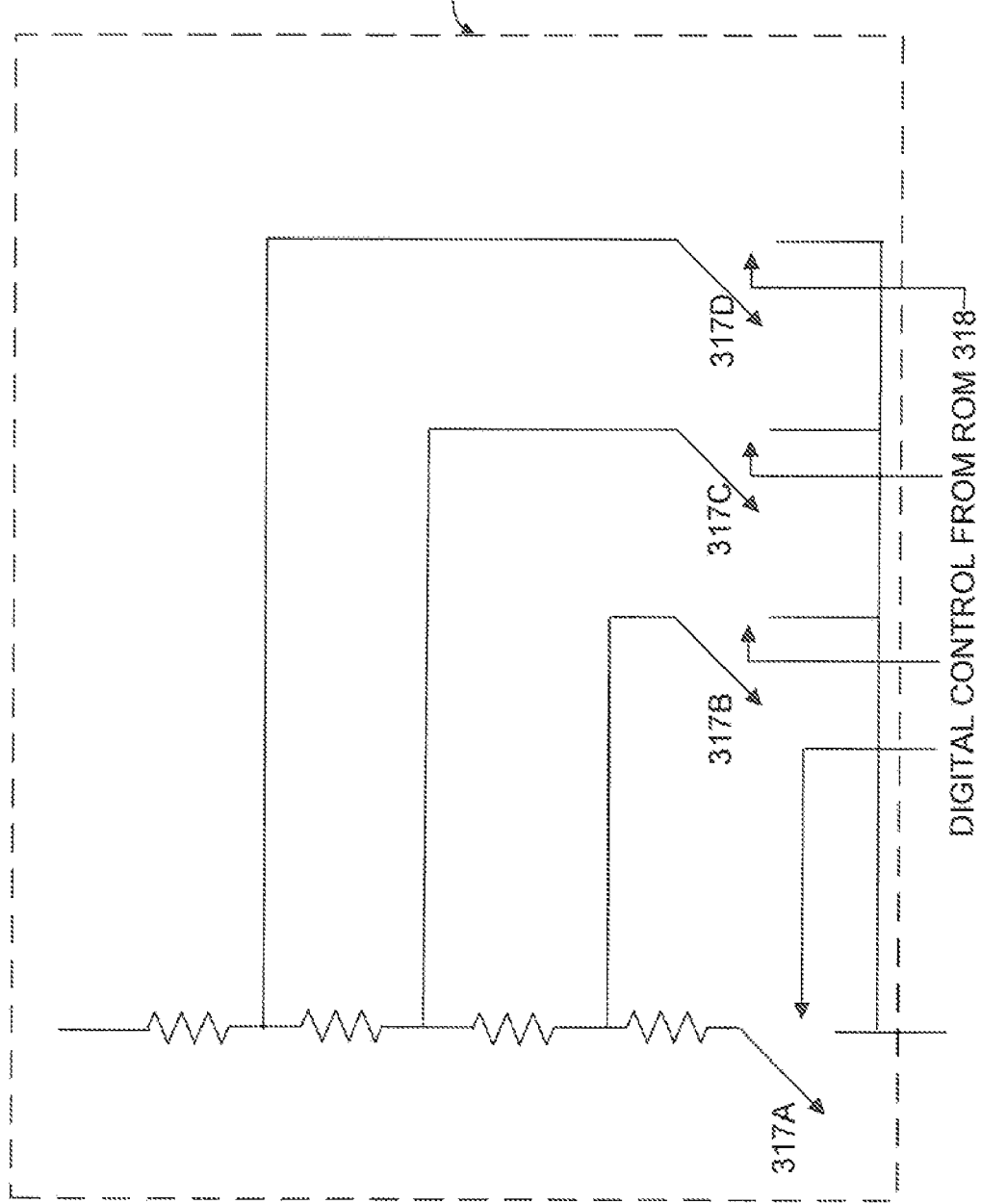
FIG. 7 is a diagram that shows a portion of FIG. 6 in greater detail.
Figure 8:
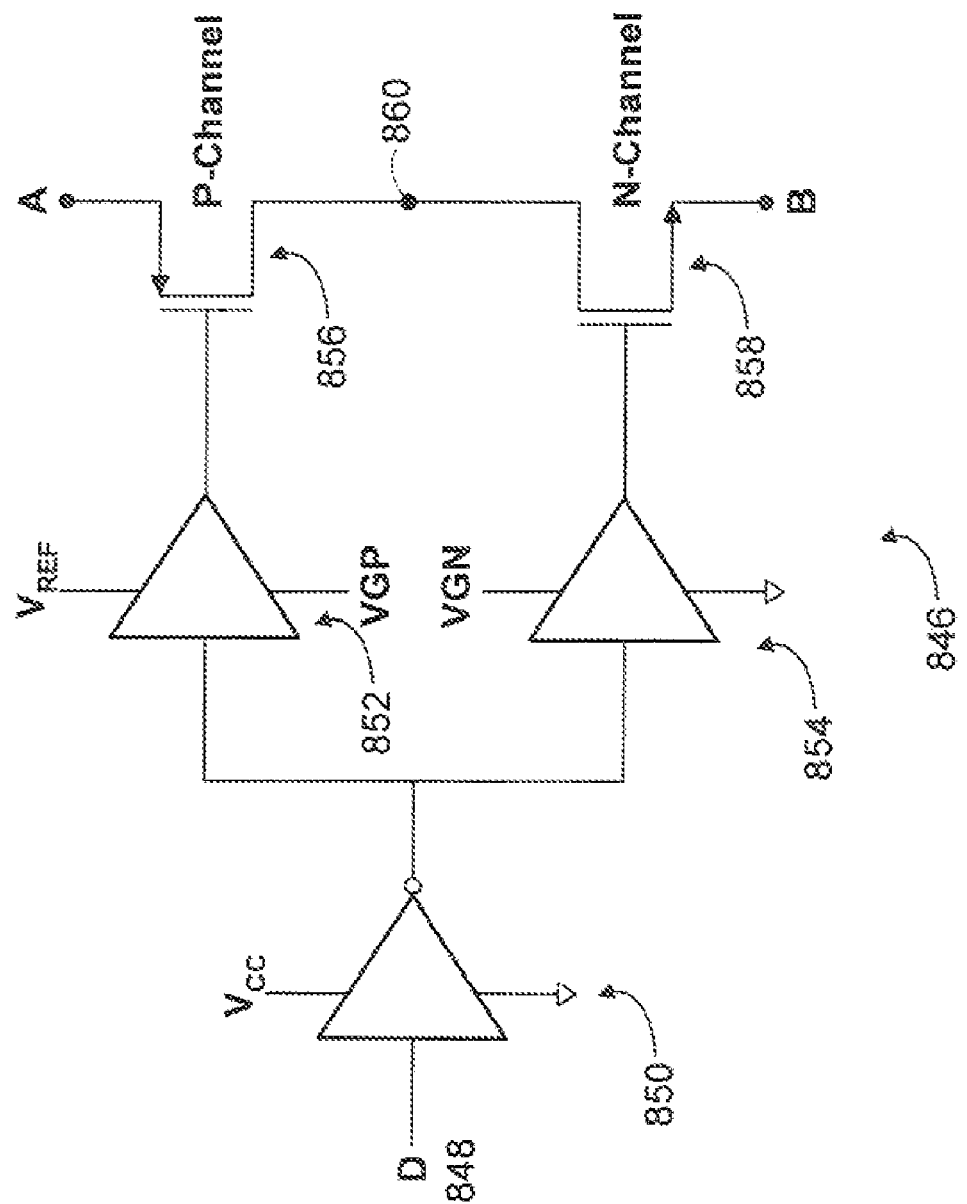
FIG. 8 is a diagram that shows a portion of FIG. 7 in greater detail.

FIGS. 6-8 show circuits that further illustrate the use of invention with respect to transmission switch structures.

FIG. 6 shows a more detailed view of resistor 312 and resistor 317. Resistor 312 is preferably controlled by digital control from ROM 318.

FIG. 7 shows a more detailed view of one implementation of resistor 317, Preferably, digital control may be input to switches 317 A-D.

FIG. 8 shows a detailed schematic diagram of an exemplary circuit 846 that may be used to implement one or all of switches 317 A-D in FIG. 7.

Circuit 846 preferably includes a control signal 848 and buffer 850. Buffer 850 may be coupled to Vcc (the supply voltage) and to ground. Control signal 848 preferably controls the operation of P-channel driver 852 and N-channel driver 854. Depending on the control signal, either VGP (the high reference gate voltage) is coupled to the gate of P-channel transistor 856 which couples A to output node 860, or VGN (the low reference gate voltage) is coupled to the gate of N-channel transistor 858, which couples B to output node 860. To reiterate, circuit 846 is a detailed schematic of one embodiment of a circuit that may be used to implement one, some or all of switches 317 A-D shown in FIG. 7.

Alternate Application of the Invention

Tapped resistor string circuits, as are used in Resistor string DACs or in interpolating DACs as shown in commonly-assigned U.S. Pat. No. 6,937,178which is hereby incorporated by reference herein in its entirety show a very similar behavior of sensitivity of transfer function to individual resistor elements to the voltage switching resistor ladder case shown above. Therefore, in both resistor string DACs and interpolating DACs the invention may preferably be applied with success. Typically, resistor strings have far more resistor elements than in a segmented Vout resistor ladder, which makes a ROM and trimdac configured according to the invention more attractive, especially if linearity is to be trimmed to low levels.

One approach of implementing the invention is to generate current reference proportional to VREF/Rstring, and use complementary current output DACs to sum in correction signals near Ground and near DACREF in the resistor string.

A second method requires Rsw tracking Rtf circuits, as disclosed in co-pending patent application entitled "SYSTEMS AND METHODS FOR SWITCH RESISTANCE CONTROL IN DIGITAL TO ANALOG CONVERTERS (DACS)" Ser. No. 11/671,628 filed on Feb. 6, 2007, but without the high capacitance drive, fast glitch recovery buffer amp. These could then be used to make clean variable resistor trimdacs tied to the top (few) and the bottom (few) resistor elements.

In another embodiment of an electronic circuit according to the invention, a circuit including a set of electronic elements may be provided. These elements may be either squally-weighted ox unequally-weighted. A set of resistors may be an example of one such set of elements. Preferably, the elements may be used to provide an output signal across a preferably predetermined range of operation.

In this embodiment of the invention, adjusting one of the elements may have a non-uniform effect on the transfer function for the electronic circuit—i.e., the effect of the adjustment on one of the elements may affect the output signal at one end of the range of operation, in a disproportionately large fashion while affecting the output signal at the other end of the range of operation in a disproportionately small fashion. Alternatively, the distribution of effect on the output signal could be in some other non-uniform distribution across the range of operation of the electronic circuit.

Accordingly, one embodiment of the invention provides that adjusting two elements of the electronic circuit, preferably substantially simultaneously, may obtain a substantially uniform effect across a predetermined range of operation of the electronic circuit. Such a uniform effect preferably serves to smooth the transfer function of the electronic circuit across the predetermined range of operation of the circuit using a minimum number of adjustments.

In one particular embodiment of the invention, the two elements being adjusted may preferably be at opposing positions with respect to the disposition of the elements in the electronic circuit. For example, one of the elements being adjusted could be at one end of the group of elements, and thereby, provide a maximum effect on one end of the range of operation of the electronic circuit, and the other of the elements could provide a maximum effect on the other end of the range of operation of the electronic circuit.

In yet another aspect of this embodiment, each of the adjustments to the two (or more) elements could be obtained using a single digital word. Alternatively, both, of the adjustments to the two (or more) digital elements could be obtained substantially simultaneously using one digital word. In other embodiments of the invention, the adjustments could preferably be obtained by adjusting, for example, resistances by fusing selected resistor links, blowing selected resistor links or by some other suitable adjustment to the resistors in the electronic circuit as is known in the art.

A more specific embodiment of the circuit may be implemented as a segmented digital to analog converter where trim can be provided for the first segment and trim can be provided for the last segment of the segmented converter. In another specific, embodiment of the invention, the circuit may be implemented as a string digital to analog converter and the trim can be applied to the first or, "top", resistor in the string and the trim can be applied to the last or, "bottom", resistor in the string, The embodiments described hereinabove are further intended to explain best modes known of practicing the invention and to enable others skilled in the art to utilize the invention, in such, or other, embodiments and with the various modifications required by the particular applications or uses of the invention.

Accordingly, the description is not intended to limit the invention to the form disclosed herein. Also, it is intended that the appended claims be construed to include alternative embodiments.

What is claimed is:

1. A trimdac circuit for adjusting the output of a digital-to-analog converter (DAC) by adjusting a plurality of thermometer-coded equivalent resistor segments in the DAC, the circuit comprising a programmable Read Only Memory (ROM), the ROM comprising a plurality of multi-bit digital words, each of the multi-bit digital words that controls a plurality of adjustable impedance structures, each of the plurality of structures that adjusts a thermometer-coded equivalent resistor segment in the DAC.

2. The circuit of claim 1, wherein each of the multi-bit digital words controls two adjustable impedance structures.

3. The circuit of claim 1, wherein each of the adjustable impedance structures is a variable resistance structure.

4. The circuit of claim 1, wherein each of the multi-bit digital words is an eight-bit digital word.

5. The circuit of claim 1, wherein a group of the most significant bits of the DAC are thermometer-coded into a corresponding group of equivalent segments.

6. A digital to analog converter (DAC) comprising the trimdac circuit of claim 1.

7. The digital to analog converter (DAC) of claim 6 wherein the DAC is an interpolating digital to analog converter.

8. A method of improving the linearity of the output of a digital-to-analog converter (DAC) the method, comprising:
  determining a non-linearity of the DAC;
  generating a multi-bit digital word in response to the determination of the non-linearity of the DAC; and
  using the multi-bit digital word to adjust at least two adjustable impedance structures, each of the adjustable impedance structures that adjusts a resistor segment in the DAC.

9. The method of claim 8 further comprising using the multi-bit digital word to adjust at least two variable resistance structures.

10. The method of claim 8 further comprising generating an eight-bit digital word in response to the determination of the non-linearity of the DAC.

11. The method of claim 8 further comprising thermometer-coding a group of most significant bits of the DAC.

12. The method of claim 8 further comprising improving the linearity of a resistor-string DAC.

13. The method of claim 8 further comprising improving the linearity of an interpolating DAC.

14. The method of claim 8 further comprising improving the linearity of an R-2R ladder network DAC.

15. A digital to analog converter (DAC) comprising:
  a plurality of thermometer-coded equivalent resistor segments; and
  a trimdac circuit for adjusting the output of the DAC, the trimdac circuit comprising:
    a programmable Read-Only-Memory (ROM), the ROM comprising a plurality of multi-bit digital words, each of the digital words that controls a plurality of variable impedance structures, each of the variable impedance structures that, adjusts a thermometer-coded equivalent resistor segment in the DAC.

16. The DAC of claim 15, wherein each of the multi-bit words controls two variable impedance structures.

17. The DAC of claim 15, wherein the DAC comprises a group of most significant bits that are thermometer-coded.

18. The DAC of claim 15, wherein the DAC is a resistor-string DAC.

19. The DAC of claim 15, wherein the DAC is an R-2R ladder network.

20. The DAC of claim 15, wherein, the DAC is an interpolating DAC.

21. A method of adjusting an electronic circuit, said method obtaining a substantially uniform effect across a range of operation of said electronic circuit, said electronic circuit comprising a plurality of elements, said method comprising:
  adjusting a first element of said plurality of elements, said adjusting obtaining a disproportional effect on the output of the electronic circuit across the range of operation of the electronic circuit;
  adjusting a second element of said plurality of elements, said adjusting the second element obtaining a disproportional effect on the output of the electronic circuit across the range of operation of the electronic circuit; and
  wherein the combination of adjusting the first element and adjusting the second element obtains an effect across the range of the output of the electronic circuit that is more uniformly distributed than the effect obtained by adjusting one of the first element and the second element.

22. The method of claim 21 further comprising adjusting the first element and the second element substantially simultaneously.

23. The method of claim 21 wherein adjusting the first element obtains a maximum effect on the output of the electronic circuit at a first end of the range of operation.

24. The method of claim 23 wherein adjusting the second element obtains a maximum effect on the output of the electronic circuit at a second end of the range of operation.

25. The method of claim 21 wherein the range of operation is defined by a range of the output signal of the electronic circuit.

26. The method of claim 21 further comprising adjusting the first element and/or the second element using a digital word.

27. The method of claim 21 further comprising adjusting the first element and the second element using a single digital word.

28. An electronic circuit comprising a substantially uniform transfer function across a range of operation of said electronic circuit, said electronic circuit comprising a plurality of elements, said circuit comprising:
  a first element of said plurality of elements, the adjustment of said first element that obtains a disproportional effect on the output of the electronic circuit across the range of operation of the electronic circuit;
  a second element of said plurality of elements, the adjustment of the second element that obtains a disproportional effect on the output of the electronic circuit across the range of operation of the electronic circuit; and
  a trim circuit that adjusts the first element and the second element, the combination of adjusting the first element and adjusting the second element that obtains an effect across the range of the output of the electronic circuit that is more uniformly distributed than the effect obtained by adjusting one of the first element and the second element.

29. The circuit of claim 28 wherein the trim circuit is adapted to adjust the first element and the second element substantially simultaneously.

30. The circuit of claim 28 wherein the adjustment of the first element is adapted to obtain a maximum effect on the output of the electronic circuit at a first end of the range of operation.

31. The circuit of claim 30 wherein the adjustment of the second element is adapted to obtain a maximum effect on the output of the electronic circuit at a second end of the range of operation.

32. The circuit of claim 28 wherein the range of operation is defined by a range of the output signal of the electronic circuit.

33. The circuit of claim 28 further comprising a digital word that is adapted to adjust the first element and/or the second element.

34. The circuit of claim 28 further comprising a single digital word that is adapted to adjust the first element and the second element substantially simultaneously.

* * * * *